(12) United States Patent
Cheng et al.

(10) Patent No.: US 6,598,201 B1
(45) Date of Patent: Jul. 22, 2003

(54) ERROR CODING STRUCTURE AND METHOD

(75) Inventors: Yaqi Cheng, Smyrna, GA (US); Michael O. Polley, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/520,566

(22) Filed: Mar. 8, 2000

Related U.S. Application Data

(60) Provisional application No. 60/124,483, filed on Mar. 15, 1999.

(51) Int. Cl.$^7$ ............................................. H03M 13/15
(52) U.S. Cl. ........................................ 714/784; 714/759
(58) Field of Search ................................ 714/784, 759

(56) References Cited

U.S. PATENT DOCUMENTS

| | | | | |
|---|---|---|---|---|
| 5,040,179 A | * | 8/1991 | Chen | 714/759 |
| 5,140,596 A | * | 8/1992 | Weldon, Jr. | 714/756 |
| 5,465,261 A | * | 11/1995 | Deschene | 714/759 |
| 5,914,969 A | * | 6/1999 | Yabuno et al. | 708/492 |
| 6,327,690 B1 | * | 12/2001 | Zhang et al. | 714/769 |
| 6,360,348 B1 | * | 3/2002 | Yang | 375/342 |

* cited by examiner

*Primary Examiner*—Stephen M. Baker
(74) *Attorney, Agent, or Firm*—Carlton H. Hoel; W. James Brady; Frederick J. Telecky, Jr.

(57) ABSTRACT

A decimated and interleaved multiplication table for finite fields as is useful in Reed-Solomon encoding computations. The generator polynomial coefficients determine the multiplication table content and ordering.

3 Claims, 3 Drawing Sheets

| INDEX | ELEMENT |
|---|---|
| 0 | 0 |
| 1 | 0 |
| ⋮ | |
| n−k−1 | 0 |
| n−k | $G_0$ |
| n−k+1 | $G_1$ |
| ⋮ | |
| 2(n−k)−1 | $G_{n-k-1}$ |
| 2(n−k) | $\alpha G_0$ |
| | $\alpha G_1$ |
| ⋮ | |
| 3(n−k)−1 | $\alpha G_{n-k-1}$ |
| 3(n−k) | $\alpha^2 G_0$ |
| | $\alpha^2 G_1$ |
| ⋮ | |
| | $\alpha^2 G_{n-k-1}$ |
| 4(n−k) | $\alpha^3 G_0$ |
| ⋮ | |
| 256(n−k)−1 | $\alpha^{254} G_{n-k-1}$ |

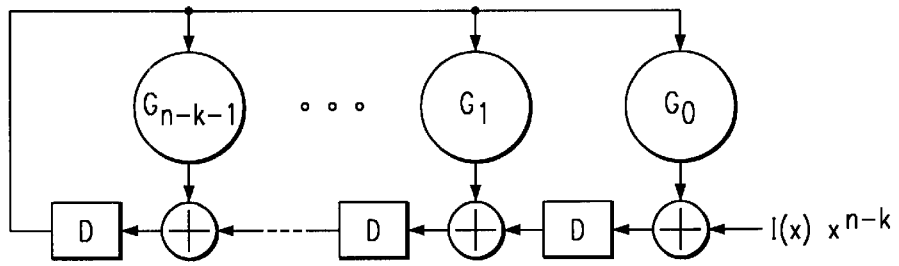
FIG. 3
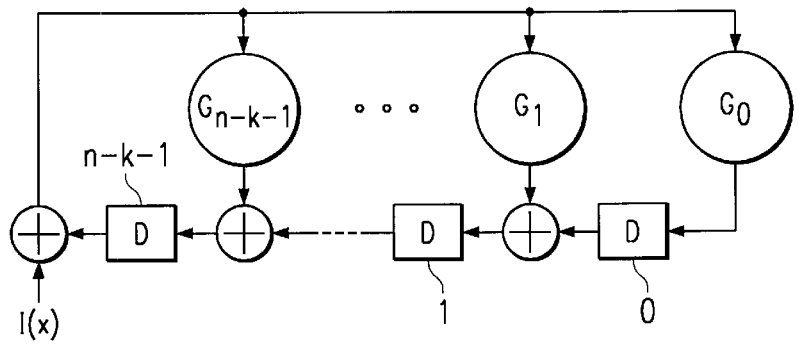
FIG. 4
| | 0 | 1 | $\alpha$ | $\alpha^2$ | | $G_1$ | | $G_0$ | | $G_2$ | | $\alpha^{254}$ |
|---|---|---|---|---|---|---|---|---|---|---|---|---|
| 0 | 0 | 0 | 0 | 0 | ... | 0 | ... | 0 | ... | 0 | ... | 0 |
| 1 | 0 | 1 | $\alpha$ | $\alpha^2$ | | $G_1$ | | $G_0$ | | $G_2$ | | $\alpha^{254}$ |
| $\alpha$ | 0 | $\alpha$ | $\alpha^2$ | $\alpha^3$ | | $\alpha G_1$ | | $\alpha G_0$ | | $\alpha G_2$ | | 1 |
| $\alpha^2$ | 0 | $\alpha^2$ | $\alpha^3$ | $\alpha^4$ | | $\alpha^2 G_1$ | | $\alpha^2 G_0$ | | $\alpha^2 G_2$ | | $\alpha$ |
| $\vdots$ | | | | | | | | | | | | |
| $\alpha^{253}$ | | | | | | | | | | | | |
| $\alpha^{254}$ | | | | | | | | | | | | $\alpha^{253}$ |
FIG. 5

| INDEX | ELEMENT |
|---|---|
| 0 | 0 |
| 1 | 0 |
| ⋮ | ⋮ |
| $n-k-1$ | 0 |
| $n-k$ | $G_0$ |
| $n-k+1$ | $G_1$ |
| | ⋮ |
| $2(n-k)-1$ | $G_{n-k-1}$ |
| $2(n-k)$ | $\alpha G_0$ |
| | $\alpha G_1$ |
| | ⋮ |
| $3(n-k)-1$ | $\alpha G_{n-k-1}$ |
| $3(n-k)$ | $\alpha^2 G_0$ |
| | $\alpha^2 G_1$ |
| | ⋮ |
| | $\alpha^2 G_{n-k-1}$ |
| $4(n-k)$ | $\alpha^3 G_0$ |
| | ⋮ |
| $256(n-k)-1$ | $\alpha^{254} G_{n-k-1}$ |

FIG. 6

ERROR CODING STRUCTURE AND METHOD

BACKGROUND OF THE INVENTION

The invention relates to electronic devices, and, more particularly, to error correction coding.

Digital communication and storage systems typically include error correction coding in order to overcome errors arising from the transmission or storage medium. Forward error-correction coding (FEC) systems add redundancy to the transmitted signal so that the receiver can detect and correct errors using only the received signal. This eliminates the need for the receiver to send requests for retransmission to the transmitter.

One of the more popular error correction code types is Reed-Solomon code. Reed-Solomon codes are block codes with maximum distance separation and are highly efficient in their use of redundancy. The most appealing aspect of Reed-Solomon codes is the availability of efficient decoding algorithms. See for example, Wicker and Bhargava (Eds.) Reed-Solomon Codes and Their Applications (IEEE Press, Piscataway, N.J., 1994).

FIG. 1 shows a high level view of a Reed-Solomon coding system. A block of information bits, I, is encoded into a codeword C which is a larger block that contains the original information and redundant bits. After transmission over a channel, the received block of bits can be represented as C+E where E is a block of error bits. The decoder generates I' from C+E, and I' will equal I if the number of errors bits in E is within the correction capabilities of the code.

FIG. 2 shows a more detailed description of Reed-Solomon coding. In particular, a block of bk information bits is divided into k groups of b bits and each group of b bits is represented by a symbol, producing a block of k information symbols for coding. The encoder operates on the block of k information symbols to produce a block of n codeword symbols containing the original information in some form as well as redundancy. The code can be designed so that the redundancy is used for error detection only, error correction only, or a combination of some error detection and some error correction. The block of n coded symbols is then translated into a block of bn bits and transmitted over the channel. The receiver front-end produces a block of bn bits that might be corrupted, depending upon the amount of channel distortion. The block of bn bits is translated into a block of n symbols and processed with the decoder. As long as the transmission errors lead to at most (n-k)/2 erroneous symbols, a hard-decision decoder can reliably recover the input k information symbols and input bk bits. The price paid for the added redundancy is the increase in the number of symbols to transmit by a factor of n/k. Of course, this means an information decrease by a factor of k/n for a constant transmission rate.

Reed-Solomon encoding essentially maps k information symbols with the symbols as elements of a finite field (Galois field or GF) with a power of 2 number of elements into n symbols which are GF elements from the same finite field to form a codeword. Note that for such field with $2^M$ elements, denoted $GF(2^M)$, the elements can be represented by M-bit words and the nonzero elements can be expressed as powers of a primitive element $\alpha$. That is, the elements of $GF(2^M)$ are $0, 1, \alpha, \alpha^2, \ldots, \alpha^q$ where $q=2^M-2$.

Nonsystematic Reed-Solomon encoding produces codewords by distributing the information and redundancy across the entire codeword of n symbols according to the coding algorithm. Systematic Reed-Solomon encoding, on the other hand, forms codewords by concatenating the k information symbols with n-k parity symbols, which are computed according to the coding algorithms. The additional n-k parity symbols contain the redundant information that is used by the receiver to choose the most likely transmitted k information symbols. In particular, with receiver soft decision the n-k parity symbols can be used to correct e error symbols and detect s erased symbols provided 2e+s is at most n-k. Note that values such as n=204 and k=188 with the GF being $GF(2^8)$ (the finite field with 256 elements) are not uncommon. Indeed, this is a commonly used code for high speed modems and would be called a (204,188) code. This code can correct 8 error symbols per 204-symbol codeword.

Systematic Reed-Solomon encoding is advantageous because the information component of the received codeword can be extracted at the receiver without applying the Reed-Solomon decoding operations. The first k symbols represent all of the information. The last n-k symbols must be computed from the information symbols.

The parity symbols can be computed from the information symbols using methods based on the arithmetic of polynomials whose coefficients are GF elements with the elements representing groups of bits. The information, parity, and codewords are represented by polynomials I(x), P(x), and C(x), respectively. For systematic Reed-Solomon encoding $C(x)=x^{n-k}I(x)+P(x)$ with P(x) the remainder from the polynomial division of $x^{n-k}I(x)$ by G(x). G(x) is the generator polynomial of the code and is a monic polynomial of degree n-k: $G(x)=x^{n-k}+G_{n-k-1}x^{n-k-1}+G_{n-k-2}x^{n-k-2}+\ldots+G_1x+G_0$, (P(x) has degree at most n-k-1. I(x) is a polynomial of degree at most k-1 with the k coefficients being the k information symbols, so C(x) is a polynomial of degree at most n-1 with coefficients being the n codeword symbols.

Most popular architectures that implement polynomial division for systematic Reed-Solomon encoding comprise feedback shift registers that are composed of delay elements, GF element multipliers, and GF element adders as shown in FIG. 3. The delay elements D are initialized with zero symbol values. The information symbols are shifted into the register one at a time, highest order element first ($I_{k-1}$). During each clock cycle of the register, the GF element held in the last delay element (leftmost) is fed back to n-k multipliers that compute the product of the feedback element with the feedback register multiplier elements $G_0$ through $G_{n-k-1}$. Because the finite field has a power of 2 number of elements, subtraction and addition are the same operation.

At each stage of the feedback register the products are added to the stored elements in the previous stage and the result is stored in the following stage. After clocking the register n times the elements stored in the delay elements D are the remainder of the division, or the parity elements that constitute the coefficients of the parity polynomial P(x). FIG. 4 shows a simplified feedback shift register that uses a pre-shifted I(x) to compute the remainder in only n-k clock cycles of the register.

It is important to understand that the architectures shown in FIGS. 3–4 evolved form a desire to efficiently implement Reed-Solomon encoders with circuit elements. In a typical encoder design, the three types of circuit elements (delays, GF adders, and GF multipliers) are individually optimized and then put together to perform the desired remainder computation operation. This type of encoder architecture can be emulated on a general purpose digital signal processing (DSP) platform. However, while either the GF multiply or the GF add can be implemented efficiently (depending upon the particular GF representation used), they cannot both be implemented efficiently simultaneously. For example, one particular representation allows GF adds to be computed with a simple exclusive-OR operation of the binary components of the two elements. In general, this can be implemented in one cycle of a DSP. However, for this same GF element representation, the GF multiply requires a large number of cycles to compute.

A GF multiplication table can be employed to reduce the number of cycles required to multiply two GF elements. However, a GF multiplication table can require a large amount of memory, and memory lookup to determine the product of two GF elements can also be somewhat time consuming.

SUMMARY OF THE INVENTION

The present invention provides a simplified finite field (Galois field or GF) multiplication table which is decimated and interleaved.

This has the advantages of allowing general purpose digital signal processors (DSPs) to efficiently perform Reed-Solomon encoding and thereby eliminating the need for specialized feedback shift register circuitry.

BRIEF DESCRIPTION OF THE DRAWINGS

The drawings are heuristic for clarity.

FIGS. 3–4 show shift registers for polynomial division.

FIG. 5 illustrates a GF(256) multiplication table.

FIG. 6 shows a preferred embodiment GF(256) multiplication table.

DESCRIPTION OF THE PREFERRED EMBODIMENTS

System overview

Figure 1:
FIGS. 1–2 schematically illustrate Reed-Solomon coding.
Figure 2:
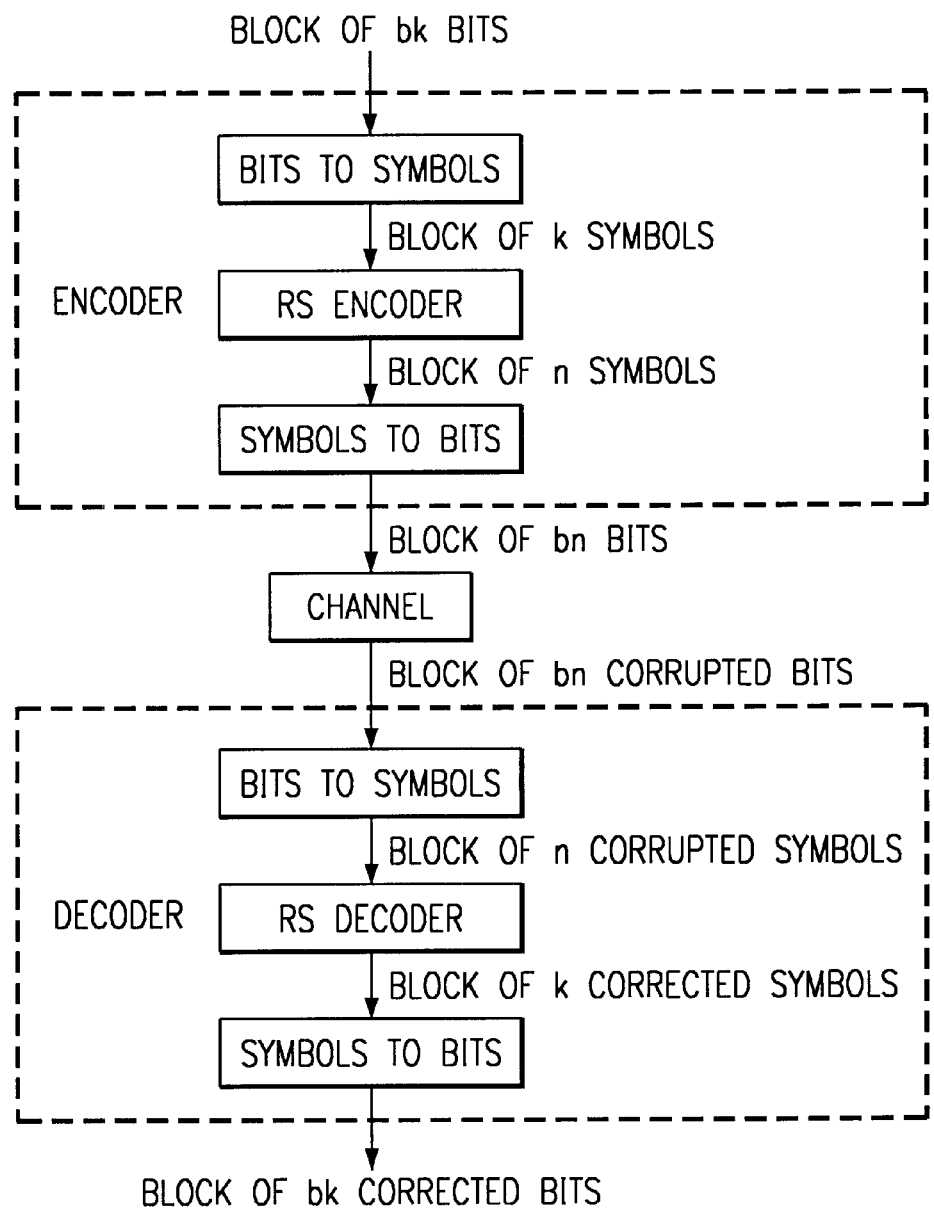

FIGS. 5–6 illustrates the preferred embodiment $GF(2^8)$ element multiplication lookup table construction by selection (decimation) of columns from a full multiplication lookup table and reordering (interleaving) for efficient access. The coefficients of the Reed-Solomon code generator polynomial as elements of the GF indicate the columns to be retained, and the memory locations used for the emulation of the delays sets the ordering of the columns. Note for a (204,188) code, the code generator polynomial $G(x)$ has degree 16, the information polynomial $I(x)$ has degree 187, and the parity polynomial $P(x)$ has degree 15; so the polynomial division has 188 steps with each step requiring 16 multiplications and 16 additions.

GF coefficient polynomial division

The preferred embodiments emulate the feedback shift register of FIG. 4 with a general purpose processor; thus consider the shift register operation. The polynomial division of $x^{n-k}I(x)$ by $G(x)$ to yield $P(x)$ proceeds in steps with each step adding the next lower power of x term to the quotient and leaving a remainder of one lower power of x. The last step generates the constant term of the quotient and yields the coefficients of the final remainder, $P(x)$, in the delays. Each step corresponds to one clock cycle in the feedback register of FIG. 4. Now $G(x)=x^{n-k}+G_{n-k-1}x^{n-k-1}+ \ldots +G_0$ and $I(x)=I_{k-1}x^{k-1}+I_{k-2}x^{k-2}+I_{k-3}x^{k-3}+ \ldots +I_0$.

Thus $x^{n-k}I(x)=I_{k-1}x^{n-1}+I_{k-2}x^{n-2}+I_{k-3}x^{n-3}+ \ldots +I_0x^{n-k}$, and the first step of the division gives a first quotient term $I_{k-1}x^{k-1}$ and a first remainder equal to $(I_{k-2}-G_{n-k-1}I_{k-1}) x^{n-2}+(I_{k-3}-G_{n-k-2}I_{k-1})x^{n-3}+ \ldots +(I_{k-1-(n-k)}-G_0I_{k-1})x^{k-1}+I_{k-2-(n-k)}x^{k-2}+I_{k-3-(n-k)}x^{k-3}+ \ldots +I_0x^{n-k}$. During the first clock cycle the feedback shift register of FIG. 4 shifts in $I_{k-1}$, computes the products $G_jI_{k-1}$ for j=0 to n-k-1, and stores them in the delays 0, 1, . . . , n-k-1. The first clock shifted in $I_{k-1}$ but the terms $I_{k-2}, I_{k-3}, \ldots I_0$ have not yet been shifted in.

The second step then gives a second quotient term $(I_{k-2}-G_{n-k-1}I_{k-1})x^{k-2}$ and a second remainder $(I_{k-3}-G_{n-k-2}I_{k-1}-(I_{k-2}-G_{n-k-1}I_{k-1})G_{n-k-1})x^{n-3}+ (I_{k-4}-G_{n-k-3}I_{k-1}-(I_{k-2}-G_{n-k-1}I_{k-1})G_{n-k-2})x^{n-4}+ \ldots +(I_{k-1-(n-k)}-G_0I_{k-1}-(I_{k-2}-G_{n-k-1}I_{k-1})G_1)x^{k-1}+(I_{k-2-(n-k)}-(I_{k-2}-G_{n-k-1}I_{k-1})G_0)x^{k-2}+I_{k-3-(n-k)}x^{k-3}+ \ldots +I_0x^{n-k}$. During the second clock cycle the shift register shifts in $I_{k-2}$, computes the terms $(I_{k-2}-G_{n-k-1}I_{k-1})G_j$ for j=0, . . . , n-k-1, subtracts (adds) them (except for j=0) from the terms $G_{j-1}I_{k-1}$, and stores in the delays. Note that the terms $(I_{k-2}-G_{n-k-1}I_{k-1})G_j$, are computed by first subtracting (adding) the product $G_{n-k-1}I_{k-1}$ (stored in delay n-k-1 by the previous clock cycle) from the shifted in $I_{k-2}$ and then multiplying the result by $G_j$ in each of the multipliers. Also, the $G_{j-1}I_{k-1}$ term to add to this product were stored in the adjacent delay from the first clock cycle and is shifted in for the addition and storage. Again, the terms $I_{k-3}, \ldots , I_0$ have not yet been shifted in.

Similarly, the successive division steps build up the remainders until the kth and last step has the remainder $P(x)$ coefficients $P_{n-k-1}, \ldots , P_0$ in the delays n-k-1, . . . , 0.

The preferred embodiments rely on the following analysis of the foregoing polynomial division. On the ith step the symbol, $M_{n-k-1}$, stored in the n-k-1 memory is subtracted (added) from the symbol $I_{k-i}$ shifted in, and the result is multiplied by each of the generator polynomial coefficients, $G_{n-k-1}, \ldots , G_0$. Thus if the symbol $I_{k-i}-M_{n-k-1}$ is denoted $\alpha^m$ where $\alpha$ is the primitive element of the GF, then the n-k multiplications are $\alpha^m G_{n-k-1}, \alpha^m G_{n-k-2}, \ldots ,$ and $\alpha^m G_0$. Hence, the multiplicands are all the same, namely, $\alpha^m$.

Now, consider implementing these multiplications by a lookup table. The element $\alpha^m$ is used to index one of the rows of the multiplication table and the element $G_j$ indexes one of the columns of the table. The consecutive multiplications executed during the clock cycle will require the same row to be accessed each time, the columns indexed correspond to elements $G_{n-k-1}, \ldots , G_0$. Therefore, the products produced by the consecutive multiplies are extracted from a given row and various columns of the table. In general, the column indices will not be consecutively ordered. For any clock cycle of the register the row index can change, but the column indexing pattern will remain the same.

The amount of memory required to store the multiplication table can be reduced by eliminating the columns that are never indexed. The remaining columns in the multiplication table correspond to the elements $G_{n-k-1}, \ldots , G_0$. Thus the memory size to store the new multiplication table with only these columns is $2^M$ by n-k where GF is the finite field $GF(2^M)$. For example, with $GF(2^8)$, the full table would be 256 by 256 elements, but with the (204,188) code the table would be only 256 by 16 elements.

The number of DSP cycles required to implement the GF multiplies by table lookup can be reduced by ordering the columns so that they correspond to the consecutive elements $G_{n-k-1}, \ldots , G_0$ (or $G_0, G_1, \ldots , G_{n-k-1}$, depending on the ordering of the memory locations emulating the delays). After ordering columns in this manner, multiplication by $\alpha^m$ is implemented by accessing the appropriate row and then reading out the consecutive n-k elements of that row.

The decimated multiplication table implementation can be further simplified by collapsing it into a one-dimensional structure where the $\alpha^m$ element determines the offset into the one-dimensional memory array. Then, n−k consecutive elements are read from consecutive memory locations in the array. In the case where each element is smaller than the accessible memory element size, several products can be accessed simultaneously. For example, if each product is an 8-bit GF element, and the DSP can access 32-bit words from memory, then four products can be read in one memory access.

FIG. 5 illustrates the conceptual manner in which the $GF(2^8)$ products of interest are extracted from a full-sized GF multiplication table and FIG. 6 shows them placed into the decimated and interleaved GF multiplication table. In this example, each GF element is represented by 8 bits. Therefore the full multiplication table contains 256 by 256 elements. The first row is trivially 0s, and so are the first n−k elements of the new array. Starting with the second row (for element $\alpha^0=1$), product element $\alpha^0 G_0$ is placed in the new array, element $\alpha^0 G_1$ is placed in the second location, and so forth up to element $\alpha^0 G_{n-k-1}$. Thus, the second n−k elements are the products of $\alpha^0$ and the ordered elements (coefficients) of the generator polynomial G(x). The products of $\alpha^1$ and the ordered elements of G(x) are placed in the next n−k array locations, and so forth. During operation, result of multiplying of $\alpha^j$ by the ordered elements of G(x) is obtained by accessing the n−k elements in the memory array starting at index j(n−k).

FIG. 6 illustrates the decimated and interleaved GF multiplication table of 256(n−k) elements. An 8-bit input or multiplicand is 0 or $\alpha^j$ for j=0,1,2, . . . ,254. The shift register multipliers (the other multiplicands) are $G_0, G_1, \ldots, G_{n-k-1}$. The products are stored as an interleaved table so that all products for any input and the shift-register multipliers can be looked up in the appropriate order within one block. This makes, it possible to perform multiple multiplications in one lookup cycle. For instance, a 32-bit load can produce the products for four 8-bit GF multiplications.

Modifications

The preferred embodiments can be modified in various ways while retaining the feature of a multiplication table decimated to the Reed-Solombn code generator polynomial coefficients and interleaved for sequential access.

For example, the finite field may have a different size; the sequential access may be adapted to another method of polynomial division.

What is claimed is:

1. A method of polynomial division with finite field coefficients, comprising the steps of:

(a) providing a finite field multiplication table with entries consisting of multiples of the coefficients of a divisor polynomial and ordered according to said coefficients of said divisor polynomial; and (b) iteratively computing partial quotients and remainders.

2. The method of claim 1, wherein:

(a) said products are ordered as $0, 0, \ldots, 0, G_0, G_1, \ldots, G_{n-k-}, \alpha G_0, \alpha G_1, \ldots, \alpha G_{n-k-1}, \alpha^2 G_0, \alpha^2 G_1, \ldots, \alpha^2 G_{n-k-1}, \ldots, \alpha^{N-2} G_{n-k-1}$, wherein said coefficients are denoted $G_0, G_1, \ldots, G_{n-k-1}$, $\alpha$ denotes a primitive element of said finite field, N is the number of elements of said finite field, and said divisor polynomial is a monic polynomial of degree n−k.

3. The method of claim 2, wherein:

(a) N=256.

* * * * *